US009054481B2

(12) United States Patent  (10) Patent No.: US 9,054,481 B2
Asano  (45) Date of Patent: Jun. 9, 2015

(54) COOLING DEVICE AND SEMICONDUCTOR LASER DEVICE

(71) Applicant: Sony Corporation, Tokyo (JP)

(72) Inventor: Yoshiro Asano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/133,886

(22) Filed: Dec. 19, 2013

(65) Prior Publication Data

US 2014/0177662 A1  Jun. 26, 2014

(30) Foreign Application Priority Data

Dec. 26, 2012  (JP) ................................. 2012-282090

(51) Int. Cl.
| | | |
|---|---|---|
| *H01S 3/04* | (2006.01) | |
| *H01S 5/022* | (2006.01) | |
| *H01S 5/024* | (2006.01) | |
| *H01S 5/06* | (2006.01) | |
| *H01S 5/40* | (2006.01) | |

(52) U.S. Cl.
CPC ... *H01S 5/02236* (2013.01); *H01L 2224/48091* (2013.01); *H01S 5/02423* (2013.01); *H01S 5/0612* (2013.01); *H01S 5/4018* (2013.01); *H01S 5/4087* (2013.01)

(58) Field of Classification Search
CPC ....... H01S 3/04; H01S 3/0401; H01S 3/0405; H01S 3/0407; H01S 3/042; H01S 5/02407; H01S 5/02423; H01S 5/02446; H01S 5/02461; H01S 5/02469; H01S 5/02476
USPC ................................................ 372/34, 35, 36
See application file for complete search history.

(56) References Cited

U.S. PATENT DOCUMENTS

| | | | | |
|---|---|---|---|---|
| 4,678,724 | A * | 7/1987 | McElroy ........................ 429/434 |
| 6,895,026 | B2 * | 5/2005 | Miyajima et al. ................ 372/36 |
| 7,436,868 | B2 * | 10/2008 | Schulte et al. ................... 372/36 |
| 7,599,414 | B2 * | 10/2009 | Miyajima et al. ................ 372/34 |
| 2008/0089371 | A1 * | 4/2008 | Reichert ........................ 372/34 |
| 2008/0184768 | A1 * | 8/2008 | Tornkvist et al. .............. 73/1.02 |
| 2012/0093183 | A1 * | 4/2012 | Liu .................................. 372/35 |

* cited by examiner

*Primary Examiner* — Tod T Van Roy
*Assistant Examiner* — Vu A Vu
(74) *Attorney, Agent, or Firm* — Wolf, Greenfield & Sacks, P.C.

(57) ABSTRACT

There is provided a semiconductor laser device including a plurality of members constituting a first group and a second group in each of which a semiconductor laser element is incorporated, a cooling jacket having, on a surface of the cooling jacket, a first region in which the member of the first group is disposed and a second region in which the member of the second group is disposed, and a cooling medium channel which is disposed in a portion close to the first region and separate from the second region inside the cooling jacket and through which a cooling medium passes.

16 Claims, 10 Drawing Sheets

COOLING DEVICE AND SEMICONDUCTOR LASER DEVICE

CROSS REFERENCE TO RELATED APPLICATIONS

This application claims the benefit of Japanese Priority Patent Application JP 2012-282090 filed Dec. 26, 2012, the entire contents of which are incorporated herein by reference.

BACKGROUND

The present disclosure relates to a semiconductor laser device to which semiconductor laser elements are attached and a cooling device used for the semiconductor laser device.

A semiconductor laser is used for a light source for a projector since light emitted therefrom has high straightness, has high brightness and high color purity. For example, JP 2011-165786A discloses that brightness of a display image is made high by arranging and using, as a light source for a projector, a plurality of semiconductor laser elements outputting light with the identical wavelength.

When a semiconductor laser is used for a light source for a projector, interference of light rays scattering on a screen with one another causes speckle noise, which is a fine dotted pattern, to be liable to arise, the speckle noise having been causing flickering on a display image.

The speckle noise is a phenomenon arising due to coherence of laser light and it is known that a measure for reducing the coherence of laser light is effective in order to reduce the speckle noise. The coherence of laser light is approximately in inverse proportion to its output spectrum width and the coherence is reduced when the output spectrum width of laser light is widened. Accordingly, widening the output spectrum width of laser light leads to reduction of the speckle noise.

JP 2011-165786A discloses, as a method for reducing the speckle noise, providing cooling parts for a pair of semiconductor laser elements, respectively, and controlling them so as to be different in cooling temperature at each cooling part. For a specific example of controlling them so as to be different in temperature, JP 2011-165786A discloses changing a cross-sectional area of a cooling medium channel inside each cooling part.

SUMMARY

However, when employing a configuration in which, for a pair of semiconductor laser elements, respective cooling parts are provided individually, the cooling part is expected for each disposing place of the semiconductor laser elements. Accordingly, in a configuration of the related art, a projector apparatus expects a number of cooling parts and also expects control of the each cooling temperature of the cooling parts to be different, causing complex configuration and control for cooling.

It is desirable to provide a semiconductor laser device and a cooling device capable of reducing speckle noise with a simple configuration which does not need complex control.

A semiconductor laser device according to an embodiment of the present disclosure includes: a plurality of members in each of which a semiconductor laser element is incorporated; and a cooling jacket in which the plurality of members are disposed. The plurality of members are divided at least into a first group and a second group and disposed on a surface of the cooling jacket. The cooling jacket has, on its surface, a first region in which the member of the first group is disposed and a second region in which the member of the second group is disposed. A cooling medium channel through which a cooling medium passes is disposed in a portion close to the first region and separate from the second region inside the cooling jacket A cooling device according to an embodiment of the present disclosure includes: a cooling jacket having, on its surface, a first region and a second region in each of which a member in which a semiconductor laser element is incorporated is disposed; and a cooling medium channel which is disposed in a portion close to the first region and separate from the second region inside the cooling jacket and through which a cooling medium passes.

According to the present disclosure, the member in which the semiconductor laser element which is disposed in each region of the cooling jacket is incorporated is cooled with the cooling medium passing through the cooling medium channel. Note that, since the cooling medium channel is close to the first region and separate from the second region, the semiconductor laser element in the first region is cooled more efficiently than the semiconductor laser element in the second region. Accordingly, the semiconductor laser element in the first region has a difference in cooling temperature from the semiconductor laser element in the second region. Since the semiconductor laser elements have temperature characteristics, wavelengths of laser light outputted by the semiconductor laser elements in the two regions are different from each other corresponding to the cooling temperature difference. Due to this, the output spectrum width of the semiconductor laser elements disposed on the cooling jacket can be widened. Widening the output spectrum width of the semiconductor laser elements leads to reduction of speckle noise.

According to the present disclosure, simply allowing a cooling medium to pass through a cooling medium channel included in one cooling jacket allows semiconductor laser elements disposed in the cooling jacket to be cooled at two different cooling temperatures, enabling speckle noise to be reduced. Accordingly, a simple configuration in which one cooling medium channel is simply provided offers an effect of providing a semiconductor laser device outputting laser light in an excellent state.

DETAILED DESCRIPTION OF THE EMBODIMENTS

Figure 1:
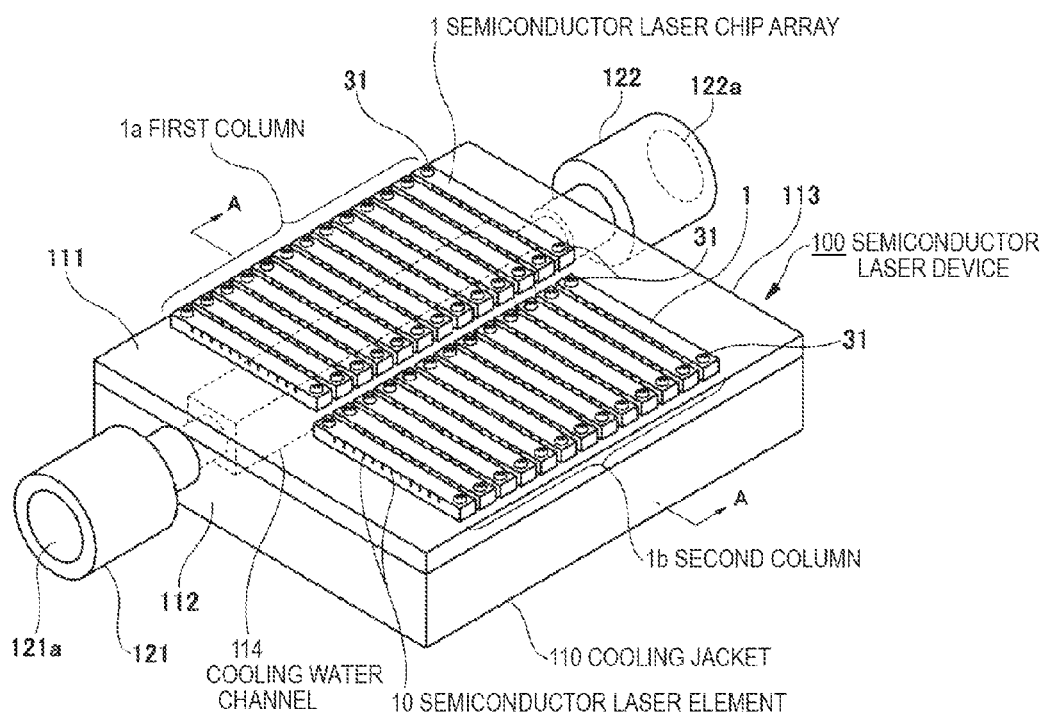
FIG. 1 is a perspective view illustrating an exemplary configuration of a semiconductor laser device according to an embodiment of the present disclosure.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

The description is made in the following order.
1. Configuration of Semiconductor Laser Device According to Embodiment (FIG. 1, FIG. 2 and FIG. 3)
2. Configuration of Semiconductor Laser Chip Array (FIG. 4)
3. Output Characteristics of Semiconductor Laser Elements (FIGS. 5A, 5B, 5C and 5D)
4. Configuration of Semiconductor Laser Device According to Variation 1 (FIG. 6 and FIG. 7)
5. Configuration of Semiconductor Laser Device According to Variation 2 (FIG. 8 and FIG. 9)
6. Configuration of Semiconductor Laser Device According to Variation 3 (FIG. 10 and FIG. 11)
7. Other Variations

[1. Configuration of Semiconductor Laser Device According to Embodiment]

Figure 2:
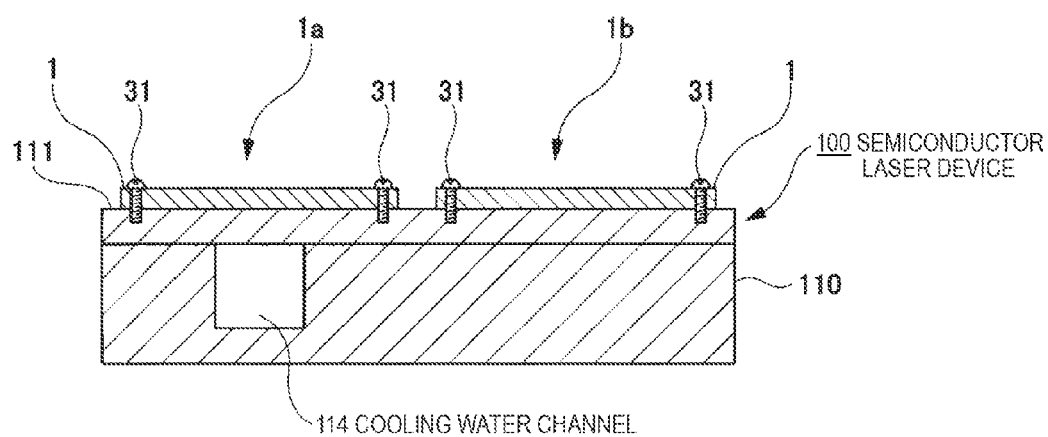
FIG. 2 is a cross-sectional view taken along with the line A-A in FIG. 1.
Figure 3:
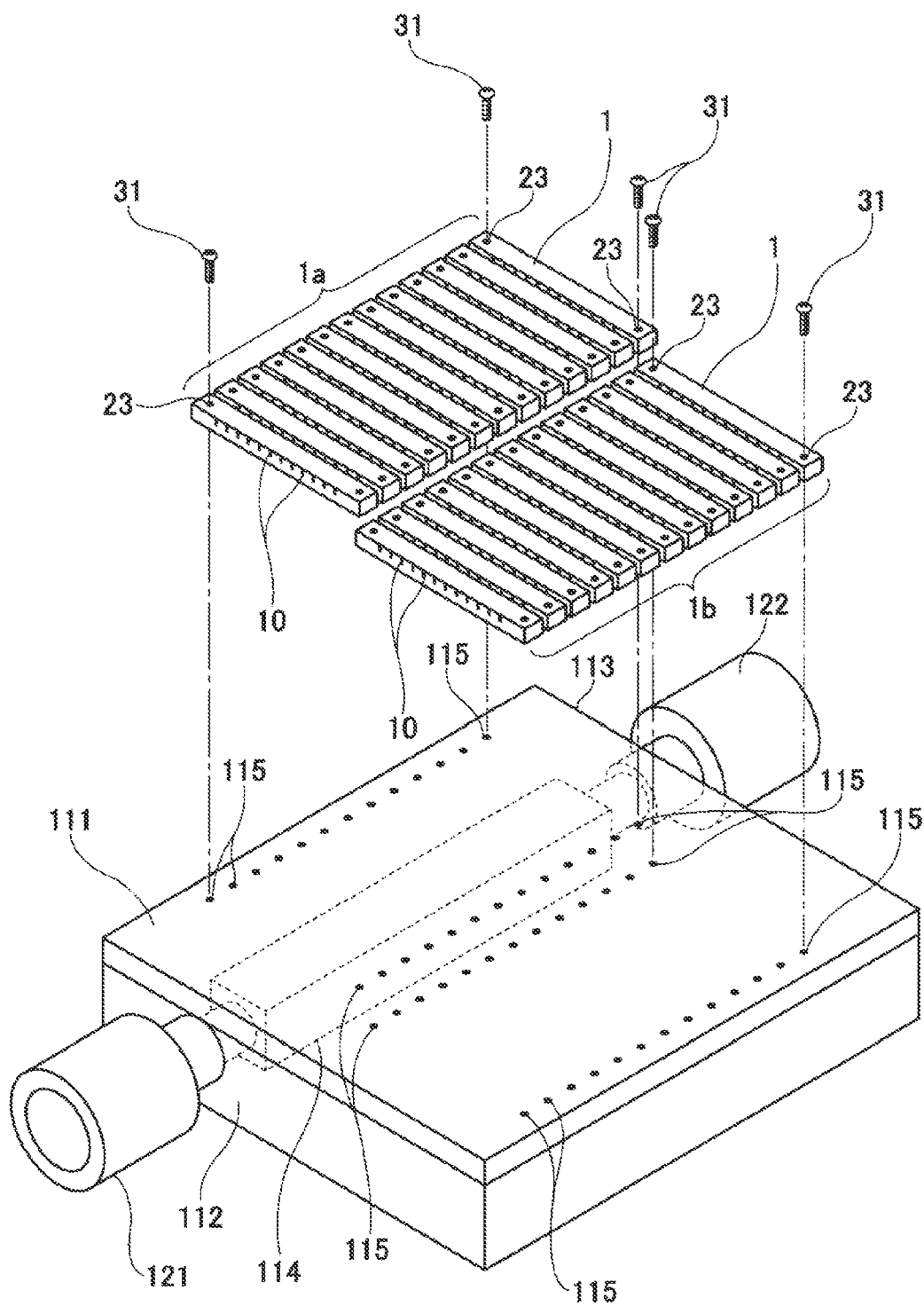
FIG. 3 is an exploded perspective view of the semiconductor laser device in FIG. 1.

FIG. 1 to FIG. 3 are diagrams illustrating a configuration of a semiconductor laser device according to an embodiment of the present disclosure. FIG. 1 is a perspective view illustrating the semiconductor laser device and FIG. 2 is a cross-sectional view taken along with the line A-A in FIG. 1. Moreover, FIG. 3 is an exploded view of the semiconductor laser device illustrated in FIG. 1.

A semiconductor laser device 100 illustrated in FIG. 1 is used for a light source of a projector apparatus performing image display. A not-shown projector apparatus includes a light source constituted of a semiconductor laser device 100 for each of the three primary colors of red, green and blue. An optical system of the projector apparatus irradiates a screen with light outputted from the semiconductor laser devices 100 for the individual colors, displaying an image. In addition, the projector apparatus may use the semiconductor laser device 100 described below as a light source for each of the three primary colors of red, green and blue, whereas a semiconductor laser device 100 may be used as a light source for one specific color such as red and light sources having another configuration may be used for the other colors, for example.

As illustrated in FIG. 1, the semiconductor laser device 100 includes a plurality of semiconductor laser chip arrays 1 each of which is a member including semiconductor laser elements 10, those arranged on a planar surface 111 of a box-shaped cooling jacket 110. In addition, the semiconductor laser elements 10 are attached to the semiconductor laser chip array 1 via sub-mounts 21 as mentioned later. The surface 111 of the cooling jacket 110 has, for example, a side of approximately centimeters to ten and several centimeters in dimension.

As illustrated in FIG. 1, the plurality of semiconductor laser chip arrays 1 are divided into two columns of a first column 1a and a second column 1b to be arranged. On each of the columns 1a and 1b, the semiconductor laser chip arrays 1 are arranged at an interval, for example, of approximately millimeters. In the example of FIG. 1, the number of the semiconductor laser chip arrays 1 of a first group which are arranged on the first column 1a is supposed to be same as that of the semiconductor laser chip arrays 1 of a second group which are arranged on the second column 1b.

The cooling jacket 110 is configured of metal high in thermal conductivity such as copper and aluminum and includes a cooling water channel 114 inside. The cooling water channel 114 is disposed close to a portion in which the semiconductor laser chip arrays 1 on the first column 1a are arranged. Namely, as illustrated in FIG. 2 as a cross-sectional view, the cooling water channel 114 is disposed with a straight line shape immediately below the region in which the semiconductor laser chip arrays 1 on the first column 1a are arranged but is not disposed immediately below the region in which the semiconductor laser chip arrays 1 on the second column 1b are arranged. The cooling water channel 114 passes through from a cooling apparatus joint 121 of a side face 112 on one side to a cooling apparatus joint 122 of a side face 113 on the other side. As illustrated in FIG. 2, the cross-sectional shape of the cooling water channel 114 is rectangular, whereas it may have another shape such as a circle. Moreover, the cooling water channel 114 may have one not being straight line-shaped as long as it is disposed below the first column 1a.

By employing such a configuration, cooling water entering through a hole 121a of the cooling apparatus joint 121 passes through the cooling water channel 114 in the cooling jacket 110 to go out through a hole 122a of the cooling apparatus joint 122. The cooling water having gone out from the cooling apparatus joint 122 is cooled by a not-shown cooling device, and after that, returns to the cooling apparatus joint 121.

FIG. 3 is an exploded view of the semiconductor laser device 100.

As illustrated in FIG. 3, screw holes 115 are provided on the surface 111 of the cooling jacket 110, corresponding to the arrangement places of the semiconductor laser chip arrays 1. Moreover, the heat sink 20 of each semiconductor laser chip array 1 has through holes 23 for inserting screws 31 at one end and the other end thereof. Furthermore, fitting the screws 31 inserted through the through holes 23 of the heat sink 20 to the screw holes 115 allows each semiconductor laser chip array 1 on the columns 1a and 1b to be attached on the surface 111 of the cooling jacket 110. Using the screws 31 is one example to attach the semiconductor laser chip arrays 1 to the cooling jacket 110 and any of other configurations may be employed.

[2. Configuration of Semiconductor Laser Chip Array]

Figure 4:
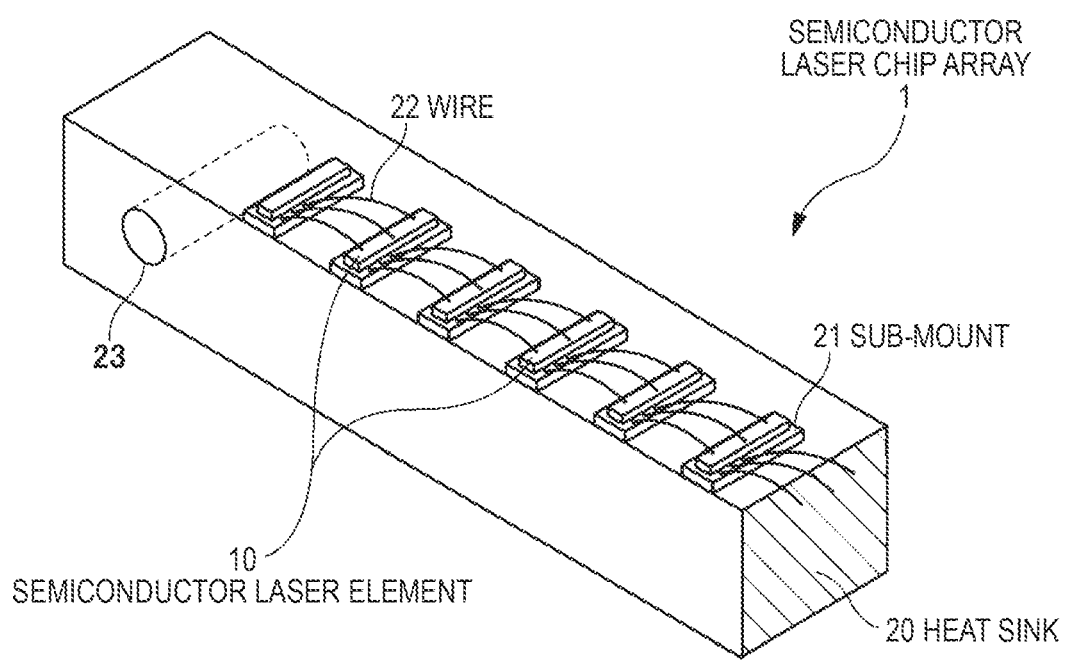
FIG. 4 is a perspective view illustrating a semiconductor laser chip array included in a semiconductor laser device according to an embodiment of the present disclosure.

FIG. 4 is a diagram illustrating a configuration of the semiconductor laser chip array 1.

In the semiconductor laser chip array 1, a plurality of semiconductor laser elements 10 are incorporated into one line on the heat sink 20 via the sub-mounts 21. For example, one semiconductor laser chip array 1 includes 8 semiconductor laser elements 10. All of the semiconductor laser elements 10 on the semiconductor laser chip arrays 1 attached to one semiconductor laser device 100 may be selected so as to have the same output wavelength, mounted on the sub-mounts.

For example, in case of the semiconductor laser device 100 used for a red light source, all of the semiconductor laser elements 10 attached to the semiconductor laser device 100 employ a center output wavelength of 640 nm. Note that their output wavelengths or output levels may have some difference due to unevenness in production of the elements.

The heat sink 20 is a heat dissipation body configured of metal high in thermal conductivity such as copper and aluminum. The sub-mounts 21 are provided and arranged independently from one another and herein one semiconductor laser element 10 is disposed on one sub-mount 21. The semiconductor laser elements 10 are connected in series herein via wires 22. Moreover, the semiconductor laser elements 10 connected in series are connected via the wires 22 to a circuit pattern connected on a semiconductor laser drive circuit side. In FIG. 4, such connection to the circuit pattern is omitted.

As illustrated in FIG. 4, the heat sink 20 includes the through hole 23 at its end part. The faces on which the through hole 23 is formed in the heat sink 20 are different faces from the face to which the semiconductor laser elements 10 are attached via the sub-mounts 21. The screw fastening using the through holes 23 allows the heat sink 20 to be fixed on the surface of the cooling jacket 110. In the state where the heat sink 20 is attached to the surface of the cooling jacket 110, as illustrated in FIG. 1 and the like, the semiconductor laser elements 10 locate on the lateral face of the heat sink 20.

Since the semiconductor laser chip array 1 has the heat sink 20 being attached thereto, the plurality of semiconductor laser elements 10 attached to one semiconductor laser chip array 1 have approximately the same temperature.

[3. Output Characteristics of Semiconductor Laser Elements]

FIGS. 5A, 5B, 5C and 5D are diagrams illustrating examples of output characteristics of the semiconductor laser device 100.

As having already been described, in the semiconductor laser device 100, the semiconductor laser chip arrays 1 are divided into the two columns of the first column 1a and second column 1b to be arranged and the cooling water channel 114 is disposed close to the first column 1a. Due to this, when the semiconductor laser device 100 is incorporated in a projector apparatus and cooling water is allowed to flow through the cooling water channel 114, the semiconductor laser chip arrays 1 on the first column 1a are cooled efficiently. The semiconductor laser chip arrays 1 on the second column 1b have slightly lower cooling efficiency than those on the first column 1a. Accordingly, difference in cooling temperature between the semiconductor laser chip arrays 1 on the first column 1a and the semiconductor laser chip arrays 1 on the second column 1b arises. By using the difference in cooling temperature, a wavelength of laser light outputted by each of the elements 10 in the semiconductor laser chip arrays 1 on the first column 1a differs from a wavelength of laser light outputted by each of the elements 10 in the semiconductor laser chip arrays 1 on the second column 1b.

Figure 5:
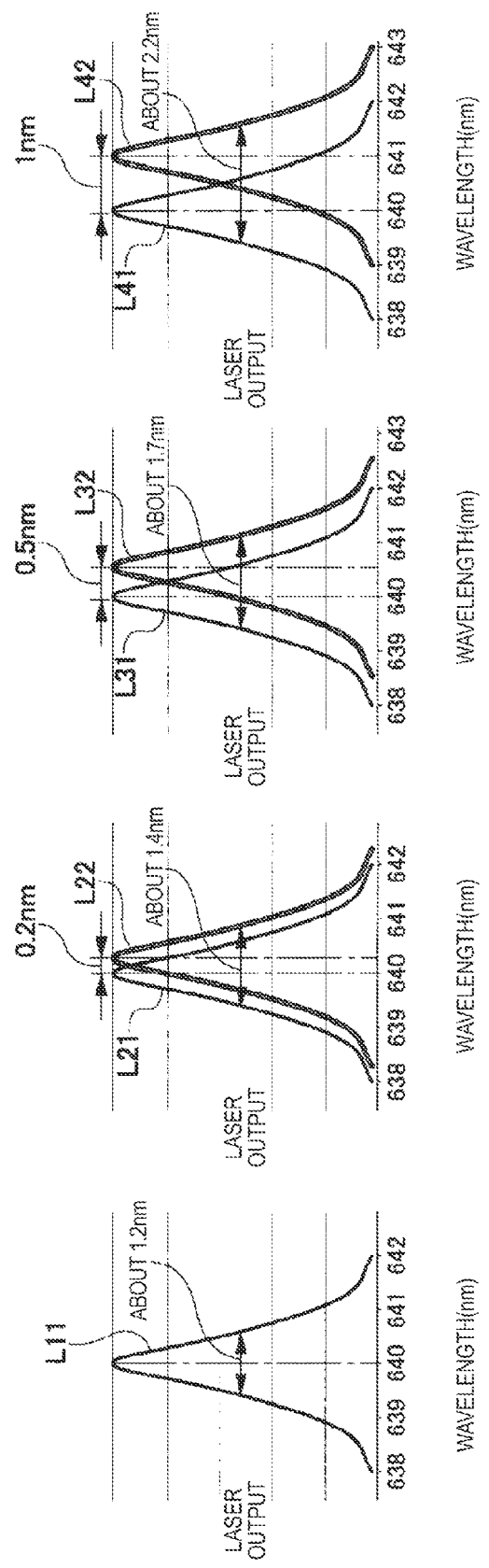
FIGS. 5A, 5B, 5C and 5D are diagrams illustrating examples of output characteristics of semiconductor laser elements.

The examples illustrated in FIGS. 5A, 5B, 5C and 5D are described individually. FIG. 5A illustrates an example in which all of the semiconductor laser chip arrays 1 share the same cooling temperature. As mentioned above, in the semiconductor laser device 100 according to an example of the embodiment, cooling temperatures for the semiconductor laser chip arrays 1 on the individual columns are different from each other, whereas, in FIG. 5A, it is supposed that all of the semiconductor laser chip arrays 1 share the same cooling temperature. The example in FIG. 5A employs cooling at 25° C. Herein, laser light L11 outputted by the semiconductor laser elements 10 has, for example, a center wavelength of 640 nm under a condition of the temperature of 25° C. and has a half-value width of approximately 1.2 nm, which is the output width for which the output is half of its highest.

FIG. 5B illustrates an example in which the semiconductor laser chip arrays 1 on the first column 1a are cooled at 25° C. and the semiconductor laser chip arrays 1 on the second column 1b are cooled at 26° C., allowing the two columns to have 1° C. of temperature difference therebetween. Herein, laser light L21 outputted by the semiconductor laser elements 10 on the first column 1a has the same characteristics as the laser light L11 in FIG. 5A and has a center wavelength of 640 nm and a half-value width of approximately 1.2 nm.

Meanwhile, laser light L22 outputted by the semiconductor laser elements 10 on the second column 1b has a center wavelength of 640.2 nm, which is 0.2 nm higher due to the 1° C.-higher temperature, and has a half-value width of approximately 1.2 nm.

Accordingly, overall characteristics obtained by integrating those of the two kinds of laser light L21 and L22 afford a half-value width of approximately 1.4 nm.

FIG. 5C illustrates an example in which the semiconductor laser chip arrays 1 on the first column 1a are cooled at 25° C. and the semiconductor laser chip arrays 1 on the second column 1b are cooled at 27.5° C., allowing the two columns to have 2.5° C. of temperature difference therebetween. Herein, laser light L31 outputted by the semiconductor laser elements 10 on the first column 1a has the same characteristics as the laser light L11 in FIG. 5A and has a center wavelength of 640 nm.

Meanwhile, laser light L32 outputted by the semiconductor laser elements 10 on the second column 1b has a center wavelength of 640.5 nm, which is 0.5 nm higher due to the 2.5° C.-higher temperature, and has a half-value width of approximately 1.2 nm.

Accordingly, overall characteristics obtained by integrating those of the two kinds of laser light L31 and L32 afford a half-value width of approximately 1.7 nm.

FIG. 5D illustrates an example in which the semiconductor laser chip arrays 1 on the first column 1a are cooled at 25° C. and the semiconductor laser chip arrays 1 on the second column 1b are cooled at 30° C., allowing the two columns to have 5° C. of temperature difference therebetween. Herein, laser light L41 outputted by the semiconductor laser elements 10 on the first column 1a has the same characteristics as the laser light L11 in FIG. 5A and has a center wavelength of 640 nm.

Meanwhile, laser light L42 outputted by the semiconductor laser elements 10 on the second column 1b has a center wavelength of 641 nm, which is 1.0 nm higher due to the 5° C.-higher temperature, and has a half-value width of approximately 1.2 nm.

Accordingly, overall characteristics obtained by integrating those of the two kinds of laser light L41 and L42 afford a half-value width of approximately 2.2 nm. The semiconductor laser device 100 according to the example of the embodiment attains approximately 5° C. of difference between the cooling temperature for the semiconductor laser chip arrays 1 on the first column 1a and the cooling temperature for the semiconductor laser chip arrays 1 on the second column 1b as illustrated in FIG. 5D here according to the disposing state of the cooling water channel 114. By doing so, the half-value width of the laser light is approximately 2.2 nm. Due to this, compared with all of the semiconductor laser chip arrays 1 being same in light emission wavelength (example of FIG. 5A), the half-value width is widened up to approximately twice, allowing the reduction of speckle noise described in BACKGROUND. Namely, when the output spectrum width at the output wavelength of laser light is narrow in projecting the laser light outputted by the semiconductor laser device 100 on a screen, flickering on an image called speckle noise arises caused by interference of light rays scattering on the screen with one another. Here, in the case of the semiconductor laser device 100 according to the example of the embodiment, the speckle noise can be reduced, the output spectrum width at the output wavelength of laser light enabled to be widened approximately twice as illustrated in FIG. 5D.

In the example of the embodiment, since the temperature difference is determined depending on the disposing state of the cooling water channel 114, when the semiconductor laser chip arrays 1 on the first column 1a can be cooled at a defined temperature such as 25° C., the temperature of the semiconductor laser chip arrays 1 on the second column 1b is automatically determined. Accordingly, in the semiconductor laser device 100 according to the example of the embodiment, the temperatures on the two columns do not have to be controlled individually, an excellent light source enabled to be attained to reduce speckle noise using an exceedingly simple configuration and control processing.

In addition, it is an example in which the two columns have 5° C. of temperature difference therebetween as illustrated in FIG. 5D. Moreover, there also be illustrated an example in which an output spectrum width is attained at the temperature difference, whereas a temperature difference exceeding 5° C. may be applicable.

While semiconductor laser elements, generally, have a wider output spectrum width as the temperature difference is larger, allowing the output wavelengths to change more, semiconductor laser elements on a side higher in temperature is to operate at a higher temperature as much. Such higher temperature in driving the semiconductor laser elements leads to a possibility to cause the operation time of the elements to be shorter as much. Herein, for example, when a preferable cooling temperature for semiconductor laser elements is 25° C. and they are cooled at 30° C., which is 5° C. higher than that, the output spectrum width can be widened while the operation time of the semiconductor laser elements is not affected so seriously. In addition, when the preferable cooling temperature of the semiconductor laser elements is 25° C., those on the first column 1a may be cooled at 20° C. and those on the second column 1b may be at 25° C.

[4. Configuration of Semiconductor Laser Device According to Variation 1]

Figure 6:
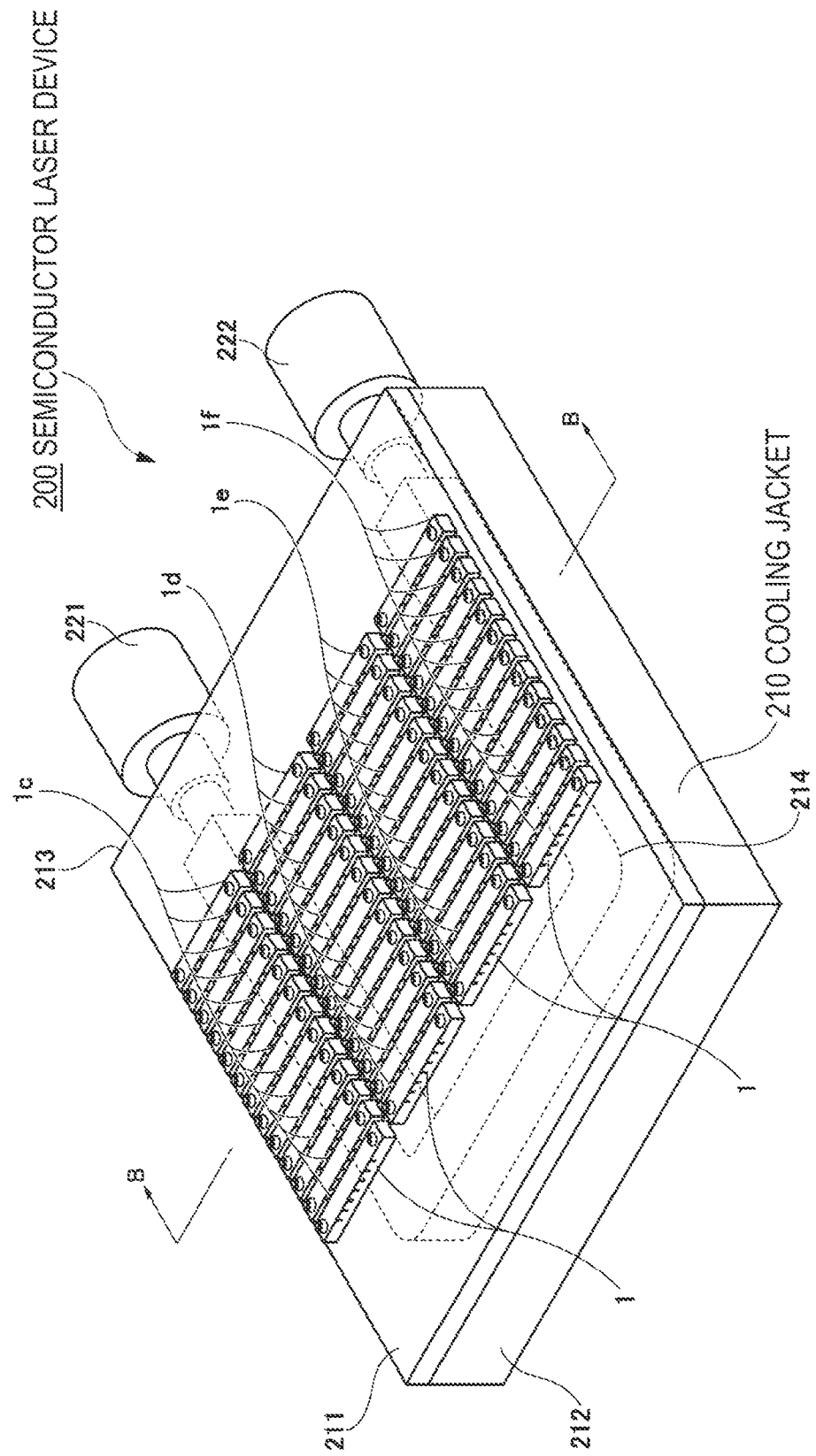
FIG. 6 is a perspective view illustrating a variation (example 1) of a semiconductor laser device according to an embodiment of the present disclosure.
Figure 7:
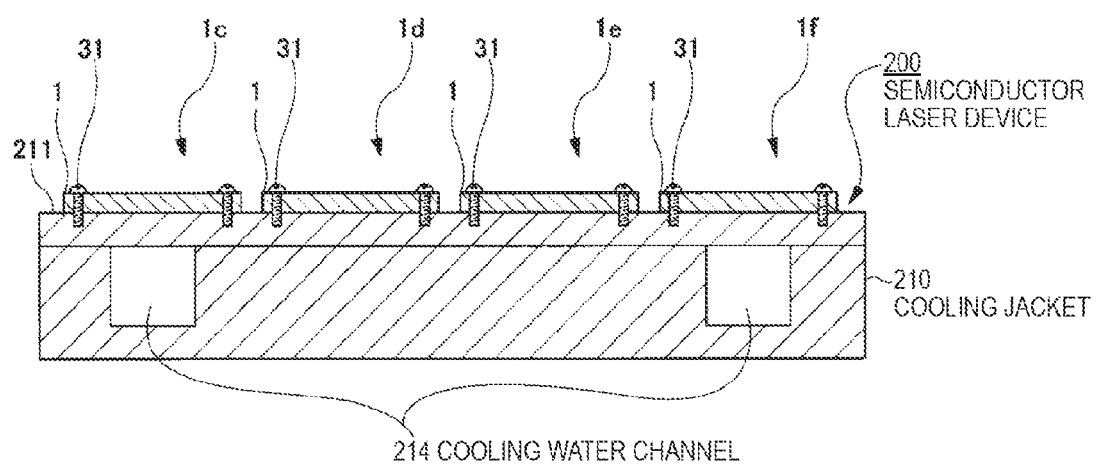
FIG. 7 is a cross-sectional view taken along with the line B-B in FIG. 6.

FIG. 6 and FIG. 7 are diagrams illustrating a semiconductor laser device according to variation 1 of an embodiment of the present disclosure. FIG. 6 is a perspective view illustrating the semiconductor laser device and FIG. 7 is a cross-sectional view taken along with the line B-B in FIG. 6.

A semiconductor laser device 200 according to an example illustrated in FIG. 6 is different from the semiconductor laser device 100 according to the example of FIG. 1 in the semiconductor laser chip arrays 1 arranged into four columns on a surface 211 of a cooling jacket 210. Namely, as illustrated in FIG. 6, the semiconductor laser device 200 includes a first column 1c, a second column 1d, a third column 1e and a fourth column 1f as columns for which the semiconductor laser chip arrays 1 are arranged on the surface 211 of the cooling jacket 210. On each of the columns 1c to 1f, a plurality of the semiconductor laser chip arrays 1 are arranged. As illustrated in FIG. 4, each semiconductor laser chip array 1 includes a plurality of the semiconductor laser elements 10.

Furthermore, the cooling jacket 210 includes a cooling water channel 214 inside. The cooling water channel 214 in the example is U-shaped and disposed close to the region in which the semiconductor laser chip arrays 1 on the first column 1c and fourth column 1f are arranged. Namely, as illustrated in FIG. 7 as a cross-sectional view, the cooling water channel 214 is disposed immediately below the region in which the semiconductor laser chip arrays 1 on the first column 1c are arranged and immediately below the region in which the semiconductor laser chip arrays 1 on the fourth column 1f are arranged but the cooling water channel 214 is not disposed immediately below the region in which the semiconductor laser chip arrays 1 on the second column 1d and third column 1e are arranged.

Since the cooling water channel 214 is U-shaped, cooling apparatus joints 221 and 222 at one end and the other end of the cooling water channel 214 is disposed side by side on a side face 213 on one side of the cooling jacket 210. The cooling apparatus joints 221 and 222 are not provided on a side face 212 on the other side.

According to the semiconductor laser device 200 illustrated in FIG. 6 and FIG. 7 here, the semiconductor laser chip arrays 1 on two columns of the first column 1c and fourth column if out of the semiconductor laser chip arrays 1 on the four columns are cooled with high cooling efficiency by the cooling water channel 214 passing close to them. Meanwhile, the semiconductor laser chip arrays 1 on the two columns of the second column 1d and third column 1e suffer less cooling efficiency than those on the first column 1c and fourth column 1f, being separate from the cooling water channel 214. Accordingly, temperatures of the semiconductor laser chip arrays 1 are divided into a first group for which cooling is performed at the defined temperature (first column 1c and fourth column 1f) and a second group for which the temperature is higher than that for the first group (second column 1d and third column 1e).

As above, dividing the temperatures into two different groups allows characteristics of the semiconductor laser chip arrays 1 to be wide in output spectrum width. For example, when the difference in temperature between the first group and second group is, for example, 5° C., the characteristics as illustrated in FIG. 5D can be attained.

[5. Configuration of Semiconductor Laser Device According to Variation 2]

Figure 8:
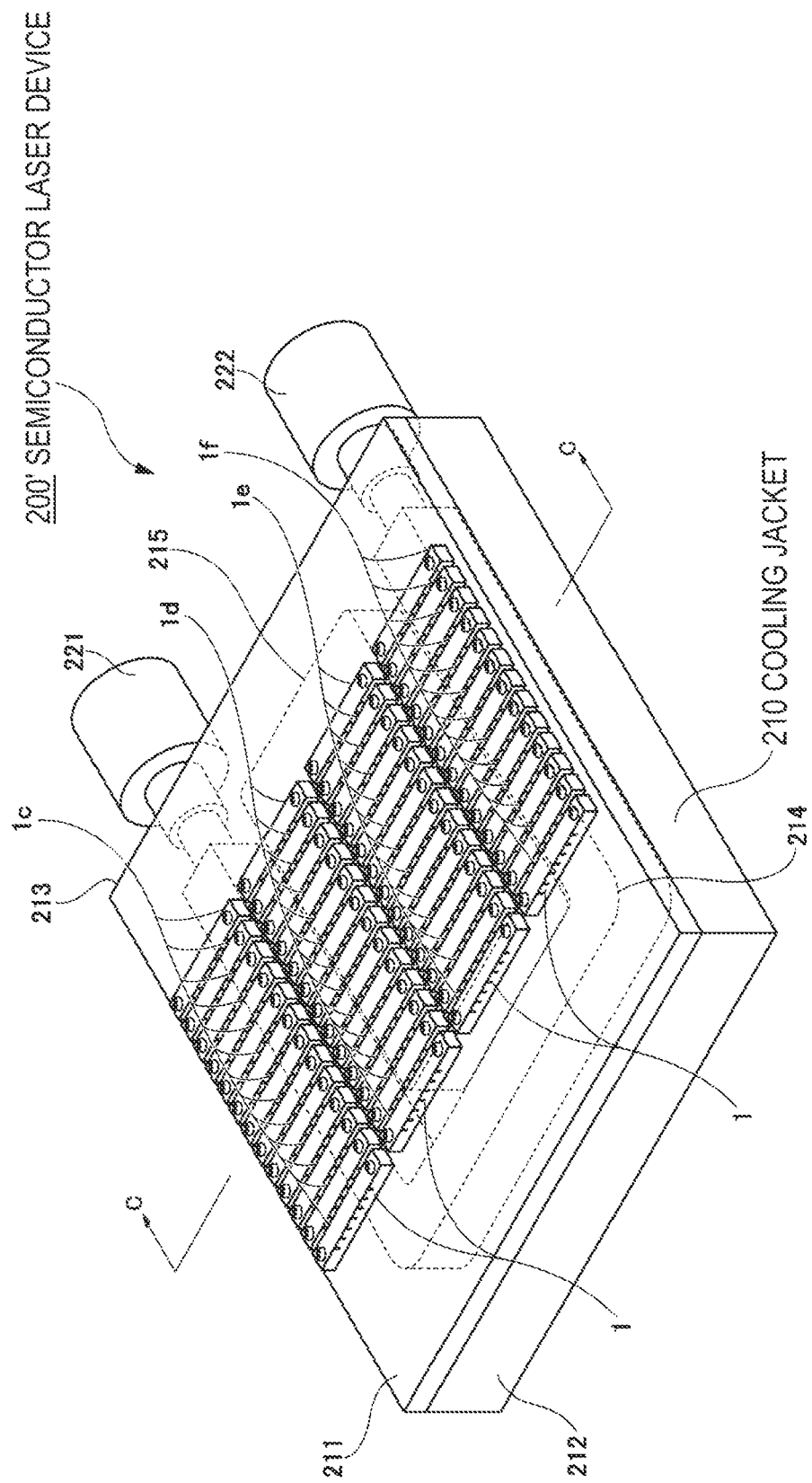
FIG. 8 is a perspective view illustrating a variation (example 2) of a semiconductor laser device according to an embodiment of the present disclosure.
Figure 9:
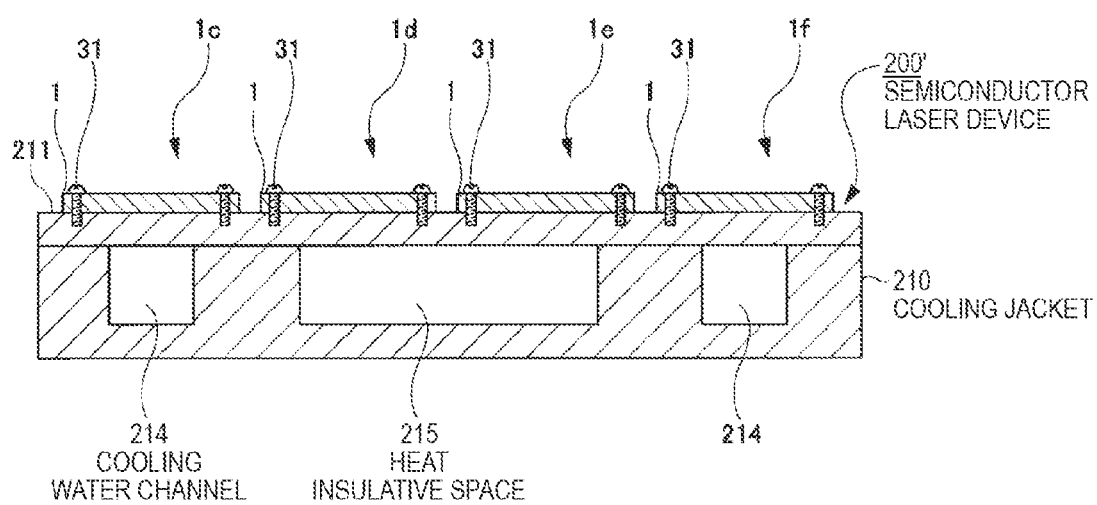
FIG. 9 is a cross-sectional view taken along with the line C-C in FIG. 8.

FIG. 8 and FIG. 9 are diagrams illustrating a semiconductor laser device according to variation 2 of an embodiment of the present disclosure. FIG. 8 is a perspective view illustrating the semiconductor laser device and FIG. 9 is a cross-sectional view taken along with the line C-C in FIG. 8. A semiconductor laser device 200' according to an example illustrated in FIG. 8 is different from the semiconductor laser device 200 according to the example illustrated in FIG. 6 in providing a heat insulative space 215 in a cooling jacket 210.

Namely, while the semiconductor laser chip arrays 1 are arranged into four columns on the surface 211 of the cooling jacket 210 and the cooling water channel 214 is disposed close to the outside two columns 1c and 1f, a heat insulative space 215 is provided close to the inside two columns 1d and 1e which are separate from the cooling water channel 214. As illustrated in FIG. 9 as a cross-sectional view, the heat insulative space 215 is disposed with a relatively large volume immediately below two columns of the second column 1d and third column 1e.

Providing the heat insulative space 215 as above allows heat generated from the semiconductor laser chip arrays 1 on the inside two columns 1d and 1e to be hard to be conducted to the cooling water channel 214. Due to this, a higher temperature difference can be attained between the semiconductor laser chip arrays 1 on the outside two columns 1c and 1f and those on the inside two columns 1d and 1e compared with that in variation 1 (example of FIG. 6).

[6. Configuration of Semiconductor Laser Device According to Variation 3]

Figure 10:
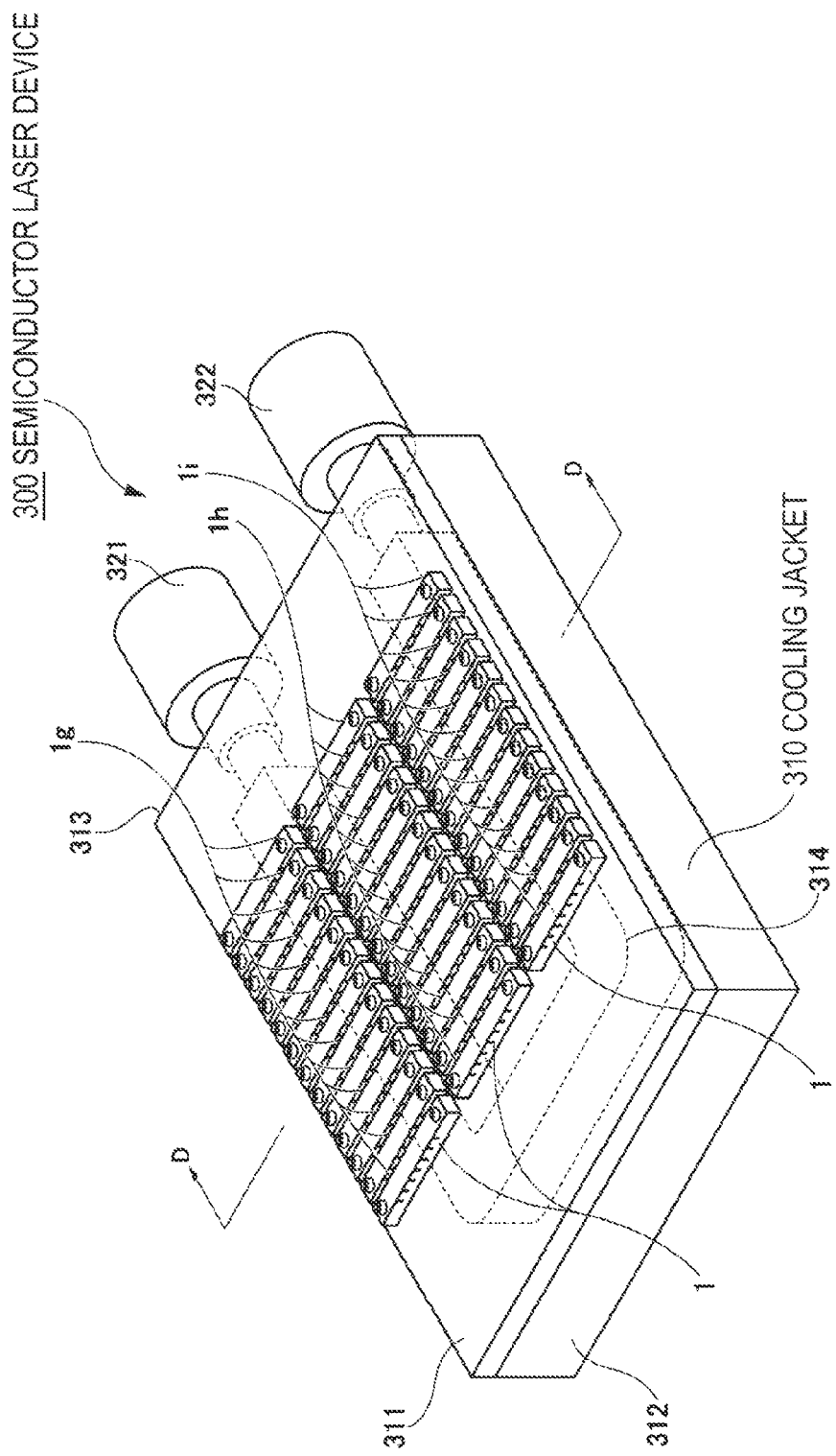
FIG. 10 is a perspective view illustrating a variation (example 3) of a semiconductor laser device according to an embodiment of the present disclosure.
Figure 11:
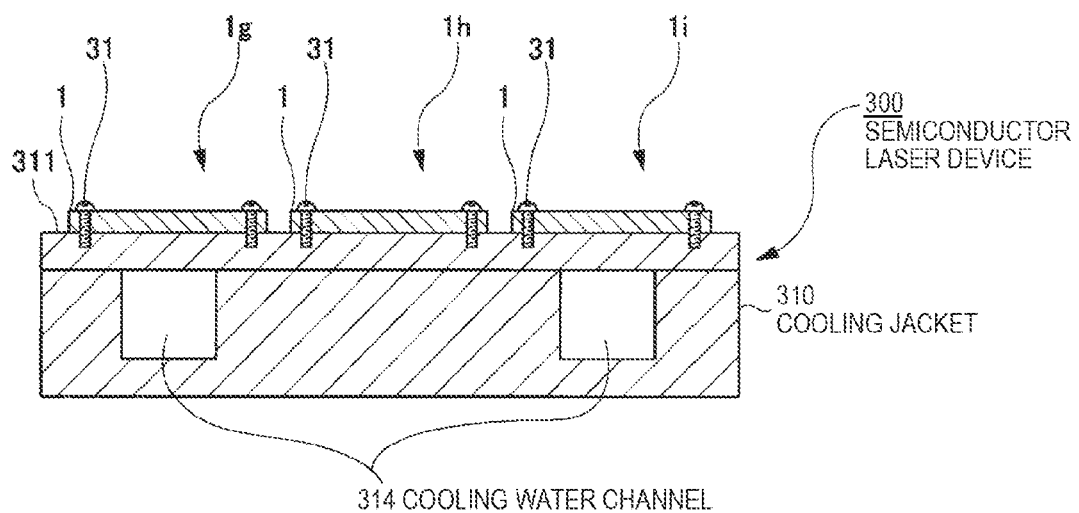
FIG. 11 is a cross-sectional view taken along with the line D-D in FIG. 10.

FIG. 10 and FIG. 11 are diagrams illustrating a semiconductor laser device according to variation 3 of an embodiment of the present disclosure. FIG. 10 is a perspective view illustrating the semiconductor laser device and FIG. 11 is a cross-sectional view taken along with the line D-D in FIG. 6.

A semiconductor laser device 300 according to an example illustrated in FIG. 10 is different from the semiconductor laser devices 100 and 200 in the examples of FIG. 1 and FIG. 6 in the semiconductor laser chip arrays 1 provided into three columns on a surface 311 of a cooling jacket 310. Namely, as illustrated in FIG. 10, the semiconductor laser device 300 includes a first column 1g, a second column 1h and a third column 1i as columns for which the semiconductor laser chip arrays 1 are arranged on the surface 211 of the cooling jacket 310. On each of the columns 1g to 1i, a plurality of the semiconductor laser chip arrays 1 are arranged. As illustrated in FIG. 4, each semiconductor laser chip array 1 includes a plurality of the semiconductor laser elements 10.

The cooling jacket 310 includes a cooling water channel 314 inside. The cooling water channel 314 in the example is U-shaped and disposed close to the region in which the semiconductor laser chip arrays 1 on the first column 1g and third column 1i. Namely, as illustrated in FIG. 7 as a cross-sectional view, the cooling water channel 314 is disposed immediately below the region in which the semiconductor laser chip arrays 1 on the first column 1g and immediately below the region in which the semiconductor laser chip arrays 1 on the third column 1i but the cooling water channel 314 is not disposed immediately below the region in which the semiconductor laser chip arrays 1 on the second column 1h.

Since the cooling water channel 314 is U-shaped, cooling apparatus joints 321 and 322 at one end and the other end of the cooling water channel 314 is disposed side by side on a side face 313 on one side of the cooling jacket 310. The cooling apparatus joints 321 and 322 are not provided on a side face 312 on the other side.

According to the semiconductor laser device 300 illustrated in FIG. 10 and FIG. 11 here, the semiconductor laser chip arrays 1 on two columns of the first column 1g and third column 1i are cooled with high cooling efficiency by the cooling water channel 314 passing close to them. Meanwhile, the semiconductor laser chip arrays 1 on the second column 1h suffer less cooling efficiency than those on the first column 1g and third column 1i, being separate from the cooling water channel 314. Accordingly, temperatures of the semiconductor laser chip arrays 1 are divided into a first group for which cooling is performed at the defined temperature (first column 1g and third column 1i) and a second group for which the temperature is higher than that for the first group (second column 1h).

Herein, supposed that the numbers of the semiconductor laser chip arrays 1 included on the columns 1g to 1i, 2/3 of the entire semiconductor laser chip arrays 1 are assigned to higher cooling efficiency and the rest 1/3 of semiconductor laser chip arrays 1 suffer less cooling efficiency.

Accordingly, also in the example, dividing cooling temperatures of the semiconductor laser chip arrays 1 into two groups is same as for the other examples, whereas the number of semiconductor laser chip arrays 1 at a low temperature can be made different from the number of semiconductor laser chip arrays 1 at a high temperature.

[7. Other Variations]

Incidentally, the semiconductor laser device according to an embodiment of the present disclosure is not limited to the configurations illustrated in the individual figures.

For example, the semiconductor laser device according to an embodiment of the present disclosure includes one of the cooling jackets 110, 210 and 310 to which the semiconductor laser chip arrays 1 in which the plurality of semiconductor laser elements 10 are arranged is attached, whereas it may include one of the cooling jackets 110, 210 and 310 to which semiconductor laser elements in another form are attached.

Specifically, semiconductor laser elements contained in circular metal casings or the like of φ9, φ5.6 or the like in dimension (can-packaged laser diodes) may be fixed to a heat sink, and after that, they may be arranged on one of the surfaces 111, 211 and 312 of the respective cooling jackets 110, 210 and 310.

Moreover, the configuration illustrated in FIG. 4 for the semiconductor laser chip arrays 1 which are members to which the semiconductor laser elements 10 are attached is simply one example, not limited to the configuration illustrated in FIG. 4. For example, in the example of FIG. 4, the semiconductor laser elements 10 are attached on the heat sink 20 via the sub-mounts 21, whereas the semiconductor laser elements 10 may be attached on the heat sink 20 directly, omitting the sub-mounts 21. The case of omitting the sub-mounts 21 can reduce thermal resistance. Note that wiring for connecting the semiconductor laser elements 10 is made complex in the case of omitting the sub-mounts 21. Namely, in the case of omitting the sub-mounts 21, the wiring is to connect the semiconductor laser elements in parallel, causing a demerit of increasing load on the current in addition to the increasing number of wires.

Moreover, in the example described using the characteristics diagrams in FIGS. 5A, 5B, 5C and 5D, the semiconductor laser chip arrays 1 attached on the surface 111 of one cooling jacket 110 are supposed to be same in output wavelength, whereas unevenness of the semiconductor laser elements 10 included by the individual semiconductor laser chip arrays 1 in output wavelength may be beforehand measured, and based on the measurement results, the semiconductor laser chip arrays 1 to be arranged on the individual columns may be determined.

For example, suppose that the output wavelength characteristics of the semiconductor laser elements 10 arranged in the individual semiconductor laser chip arrays 1 have unevenness within a range of 640 nm to 640.5 nm in center wavelength, the semiconductor laser chip arrays 1 to which the semiconductor laser elements 10 with a center wavelength close to 640 nm are attached are arranged on a column for cooling at a low temperature (first column 1a in the case of FIG. 6). Moreover, the semiconductor laser chip arrays 1 to which the semiconductor laser elements 10 with a center wavelength close to 640.5 nm are attached are arranged on a column of a high temperature (second column 1b in the case of FIG. 6).

This leads to a synergetic effect of the wavelength difference due to the difference of the cooling temperatures and the wavelength difference due to unevenness of the individual semiconductor laser elements 10, enabling a larger wavelength difference and enhancing the effect of reduction of speckle noise.

Moreover, taking account of unevenness of output levels of the individual semiconductor laser elements 10, the semiconductor laser chip arrays 1 arranged on the individual columns may be determined. Namely, when mixing semiconductor laser element with good light emission efficiency and semiconductor laser element with poor light emission efficiency, under usage thereof at the same temperature, there is a difference in light output between the individual semiconductor laser elements 10, whereas the semiconductor laser chip arrays 1 to which the semiconductor laser elements 10 with poor light emission efficiency are arranged on a column for cooling at a low temperature (first column 1a in the case of FIG. 6) and the semiconductor laser chip arrays 1 to which the semiconductor laser elements 10 with good light emission efficiency are arranged on a column of a high temperature (second column 1b in the case of FIG. 6).

This leads to the difference between the cooling temperatures also correcting the output level, enabling unevenness of the output level of the plurality of semiconductor laser elements 10 to be corrected.

In addition, combining the unevenness of the output wavelength characteristics of the semiconductor laser elements 10 with the unevenness of the output level of the semiconductor laser elements 10, the semiconductor laser chip arrays 1 arranged on the individual columns may be determined.

Moreover, the cooling jacket described in each example includes a cooling water channel allowing cooling water to flow, whereas another cooling jacket may be applied to use a cooling medium other than the cooling water.

Additionally, the present disclosure may also be configured as below.

(1)
A semiconductor laser device including:
a plurality of members constituting a first group and a second group in each of which a semiconductor laser element is incorporated;
a cooling jacket having, on a surface of the cooling jacket, a first region in which the member of the first group is disposed and a second region in which the member of the second group is disposed; and
a cooling medium channel which is disposed in a portion close to the first region and separate from the second region inside the cooling jacket and through which a cooling medium passes.

(2)
The semiconductor laser device according to (1),
wherein the member is a laser element array in which a plurality of semiconductor laser elements are arranged on a heat sink or a laser element array in which a plurality of semiconductor laser elements on sub-mounts are arranged on a heat sink.

(3)
The semiconductor laser device according to (1) or (2),
wherein the first region is a region which is divided into a plurality of regions,
wherein the second region is disposed between one region and another region of the first region, and
wherein the cooling medium channel is disposed to pass close to the one region and the another region.

(4)
The semiconductor laser device according to any one of (1) to (3),
wherein a heat insulative space through which the cooling medium does not pass is disposed in the cooling jacket close to the second region.

(5)
The semiconductor laser device according to any one of (1) to (4),
wherein the member of the first group and the member of the second group are distributed based on an individual difference of output laser light of the incorporated semiconductor laser elements, and
wherein the semiconductor laser element incorporated in the member disposed in the first region has a difference in wavelength or output level of the output laser light from the semiconductor laser element incorporated in the member disposed in the second region.

(6)
A cooling device including:
a cooling jacket having, on a surface of the cooling jacket, a first region and a second region in each of which a member in which a semiconductor laser element is incorporated is disposed; and
a cooling medium channel which is disposed in a portion close to the first region and separate from the second region inside the cooling jacket and through which a cooling medium passes.

(7)
The cooling device according to (6),
wherein a heat insulative space through which the cooling medium does not pass is disposed in the cooling jacket close to the second region.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor laser device comprising:
a plurality of members constituting a first group and a second group in each of which a semiconductor laser element is incorporated;
a cooling jacket having, on a surface of the cooling jacket, a first region in which a member of the first group is disposed and a second region in which a member of the second group is disposed; and
a cooling medium channel which is disposed inside the cooling jacket closer to the first region than to the second region, wherein the cooling medium channel reduces a temperature of at least one first semiconductor laser element of the first group, thereby changing an emission wavelength of the at least one first semiconductor laser element with respect to an emission wavelength of at least one second semiconductor laser element of the second group due to the cooling medium channel being closer to the first region than the second region.

2. The semiconductor laser device according to claim 1, wherein at least one member of the plurality of members is a laser element array in which a plurality of semiconductor laser elements are arranged on a heat sink or a laser element array in which a plurality of semiconductor laser elements on sub-mounts are arranged on a heat sink.

3. The semiconductor laser device according to claim 1,
wherein the first region is a region which is divided into a plurality of regions, wherein the second region is disposed between respective regions of the plurality of regions, and
wherein the cooling medium channel is disposed to pass proximate to the respective regions.

4. The semiconductor laser device according to claim 1,
wherein a heat insulative space through which the cooling medium does not pass is disposed in the cooling jacket proximate to the second region.

5. The semiconductor laser device according to claim 1,
wherein the member of the first group and the member of the second group are distributed based on an individual difference of output laser light of the incorporated semiconductor laser elements, and
wherein the semiconductor laser element incorporated in the member disposed in the first region has a difference in wavelength or output level of the output laser light from the semiconductor laser element incorporated in the member disposed in the second region.

6. The semiconductor laser device of claim 1, wherein the cooling medium channel is disposed underneath the first region and not underneath the second region.

7. The semiconductor laser device of claim 1, wherein the plurality of members are on an exterior surface of the cooling jacket.

8. A cooling device comprising:
a cooling jacket having, on a surface of the cooling jacket, a first region and a second region in each of which a member in which a semiconductor laser element is incorporated is disposed; and
a cooling medium channel which is disposed inside the cooling jacket closer to the first region than to the second region, wherein the cooling medium channel reduces a temperature of at least one first semiconductor laser element of the first group, thereby changing an emission wavelength of the at least one first semiconductor laser element with respect to an emission wavelength of at least one second semiconductor laser element of the second group due to the cooling medium channel being closer to the first region than the second region.

9. The cooling device according to claim 8,
wherein a heat insulative space through which the cooling medium does not pass is disposed in the cooling jacket close to the second region.

10. A semiconductor laser device comprising:
a plurality of members constituting a first group and a second group in each of which a semiconductor laser element is incorporated;
a cooling jacket having, on a surface of the cooling jacket, a first region in which the member of the first group is disposed and a second region in which the member of the second group is disposed, wherein the member of the first group and the member of the second group are distributed based on an individual difference of output laser light of the incorporated semiconductor laser elements, and the semiconductor laser element incorporated in the member disposed in the first region has a difference in wavelength or output level of the output laser light from the semiconductor laser element incorporated in the member disposed in the second region; and
a cooling medium channel which is disposed inside the cooling jacket closer to the first region than to the second region.

11. The semiconductor laser device of claim 10, wherein at least one member of the plurality of members is a laser element array in which a plurality of semiconductor laser elements are arranged on a heat sink or a laser element array in which a plurality of semiconductor laser elements on submounts are arranged on a heat sink.

12. The semiconductor laser device according to claim 10, wherein the first region is a region which is divided into a plurality of regions, wherein the second region is disposed between respective regions of the plurality of regions, and
wherein the cooling medium channel is disposed to pass proximate to the respective regions.

13. The semiconductor laser device according to claim 10, wherein a heat insulative space through which the cooling medium does not pass is disposed in the cooling jacket proximate to the second region.

14. The semiconductor laser device of claim 10, wherein the cooling medium channel is disposed underneath the first region and not underneath the second region.

15. The semiconductor laser device of claim 10, wherein the cooling medium channel reduces a temperature of at least one first semiconductor laser element of the first group, thereby changing an emission wavelength of the at least one first semiconductor laser element with respect to an emission wavelength of at least one second semiconductor laser element of the second group due to the cooling medium channel being closer to the first region than the second region.

16. The semiconductor laser device of claim 10, wherein the plurality of members are on an exterior surface of the cooling jacket.

* * * * *